(12) United States Patent
Pasadyn et al.

(10) Patent No.: US 6,708,129 B1
(45) Date of Patent: Mar. 16, 2004

(54) METHOD AND APPARATUS FOR WAFER-TO-WAFER CONTROL WITH PARTIAL MEASUREMENT DATA

(75) Inventors: Alexander J. Pasadyn, Austin, TX (US); Matthew A. Purdy, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 293 days.

(21) Appl. No.: 10/023,225

(22) Filed: Dec. 13, 2001

(51) Int. Cl.[7] ............................................. G06F 19/00
(52) U.S. Cl. ........................ 702/81; 700/116; 700/121
(58) Field of Search .......................... 702/81; 700/116, 700/121; 438/17; 257/48

(56) References Cited

U.S. PATENT DOCUMENTS 6,486,492 B1 * 11/2002 Su ................................ 257/48

* cited by examiner

*Primary Examiner*—John Barlow
*Assistant Examiner*—Stephen J. Cherry
(74) *Attorney, Agent, or Firm*—Williams, Morgan & Amerson, P.C.

(57) ABSTRACT

A method and an apparatus for performing a process control using partial measurement data. A process operation is performed on a semiconductor wafer. Inline metrology data related to the process of the semiconductor wafer is acquired. A partial measurement data acquisition process is performed based upon the inline metrology data, the partial measurement data acquisition process comprising determining a time period for acquiring the inline metrology data, determining a number of wafers to be sampled based upon the time period, and determining a number of wafer sites for data acquisition. At least one of a feedback adjustment on a second semiconductor wafer and a feed-forward adjustment relating to a subsequent processing of the first semiconductor wafer based upon the partial measurement data acquisition process is performed.

27 Claims, 9 Drawing Sheets

METHOD AND APPARATUS FOR WAFER-TO-WAFER CONTROL WITH PARTIAL MEASUREMENT DATA

BACKGROUND OF THE INVENTION

1. Field of the Invention

This invention relates generally to semiconductor manufacturing, and, more particularly, to a method and apparatus using metrology data from an integrated source for performing sampling of semiconductor wafer in a process flow.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot. For example, a process layer composed of a variety of materials may be formed above a wafer. Thereafter, a patterned layer of photoresist may be formed above the process layer using known photolithography techniques. Typically, an etch process is then performed on the process layer using the patterned layer of photoresist as a mask. This etching process results in formation of various features or objects in the process layer. Such features may be part of a completed integrated circuit device, e.g., a gate electrode structure for transistors. Many times, trench structures are also formed on the substrate of the semiconductor wafer. One example of a trench structure is a shallow trench isolation (STI) structure, which can be used to isolate electrical areas on a semiconductor wafer.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The wafer 105 typically includes a plurality of individual semiconductor die 103 arranged in a grid 150. Photolithography steps are typically performed by a stepper on approximately one to four die locations at a time depending on the specific photomask employed. Photolithography steps are generally performed to form patterned layers of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the under-lying layer. The patterned layer of photoresist is comprised of a plurality of features, e.g., line-type features, such as a polysilicon line, or opening-type features, that are to be replicated in an underlying process layer.

Generally, in semiconductor-wafer manufacturing, wafers are processed before being analyzed by metrology tools. Subsequent processes performed on the wafers may lack the benefit of efficient metrology data analysis of the same wafers. By the time metro logy data is collected from a first process, the analysis is performed such that often the benefit of analysis and the modification data resulting from the analysis does not reach the next process performed on the semiconductor wafers 105. Generally, metrology data analysis and the processing of semiconductor wafers 105 are separate functions performed in a manufacturing setting.

Turning now to FIG. 2, one example of a block diagram representation of a typical manufacturing process flow is illustrated. A set of semiconductor wafers 105 is processed by a manufacturing system (block 210). Once the semiconductor wafers 105 are processed, offline metrology data is acquired (block 220). Often, metrology data is acquired uniformly across a plurality of semiconductor wafers 105. In other words, the same number of sites are generally analyzed on all of the processed semiconductor wafers 105 during acquisition and analysis of metrology data.

Once offline metrology data is acquired, the manufacturing system analyzes the metrology data (block 230) and calculates correction factors to be implemented for the next processing run on the semiconductor wafers 105 (block 240). These correction factors can be used to modify one or more control parameters that control the operations of the manufacturing system. The manufacturing system utilizes a finite amount of time to acquire metrology data and calculate correction data. If a second process performed on the semiconductor wafers 105 were performed immediately after the first process, it would be difficult to deliver correction data for implementation into the subsequent process. The manufacturing system generally acquires the metrology data, makes the correction calculations, and then performs the next run of semiconductor wafers 105 using the correction factors (block 250).

The process flow described in FIG. 2 provides for performing feed-forward corrections, although not necessarily in an efficient manner. Interruptions of the process flow from one process to another in order to acquire metrology data can slow down an assembly line that manufactures semiconductor wafers 105. Interruptions in the process flow can also cause delay in delivery of products made from semiconductor wafers and other costs. The interruption suffered by the manufacturing line to produce feed-forward data can cause inefficiencies in a manufacturing environment. Any pause or interruption in manufacturing can be costly and can cause further deviations in critical accuracies that are needed for proper manufacturing of semiconductor wafers 105. Furthermore, the correction data that is produced by the manufacturing system of FIG. 2 generally is available too late for use in the second processing indicated in block 230. Thus, semiconductor wafers 105 with non-corrected errors may be produced by the manufacturing system shown in FIG. 2. Devices produced from the processed semiconductor wafers 105 may contain excessive amounts of errors, which can adversely affect the overall yield of the manufacturing process. Furthermore, inefficiencies due to many of the current manufacturing correction procedures can prove to be very costly.

The present invention is directed to overcoming, or at least reducing the effects of, one or more of the problems set forth above.

SUMMARY OF THE INVENTION

In one aspect of the present invention, a method is provided for performing a process control using partial measurement data. A process operation is performed on a semiconductor wafer. Inline metrology data related to the process of the semiconductor wafer is acquired. A partial measurement data acquisition process is performed based upon the inline metrology data, the partial measurement data acquisition process comprising determining a time period for acquiring the inline metrology data, determining a number of wafers to be sampled based upon the time period, and determining a number of wafer sites for data acquisition. At least one of a feedback adjustment on a second semiconductor wafer and a feed-forward adjustment relating to a subsequent processing of the first semiconductor wafer based upon the partial measurement data acquisition process is performed.

In another aspect of the present invention, a system is provided for performing a process control using partial measurement data. The system of the present invention comprises: a processing tool to process a semiconductor wafer; an integrated metrology tool integrated into the processing tool, the integrated metrology tool to acquire inline metrology data; a process controller operatively coupled to the processing tool and the integrated metrology tool. The process controller to perform an inline metrology feedback/feed-forward operation, the inline metrology feedforward operation comprising: acquiring inline metrology data related to a first process of a semiconductor wafer using an integrated metrology tool; performing a partial measurement data acquisition process based upon the inline metrology data, the partial measurement data acquisition process comprising determining a time period for acquiring the inline metrology data, determining a number of wafers to be sampled based upon the time period, and determining a number of wafer sites for data acquisition. The system of the present invention further comprises: an inline metrology data storage unit operatively coupled to the process controller, the inline metrology data storage unit to receive the inline metrology data; and a feedback/feed-forward unit operatively coupled to the process controller, the feedback/feed-forward unit to perform the feedback/feed-forward operation.

BRIEF DESCRIPTION OF THE DRAWINGS

The invention may be understood by reference to the following description taken in conjunction with the accompanying drawings, in which like reference numerals identify like elements, and in which.

Figure 1:
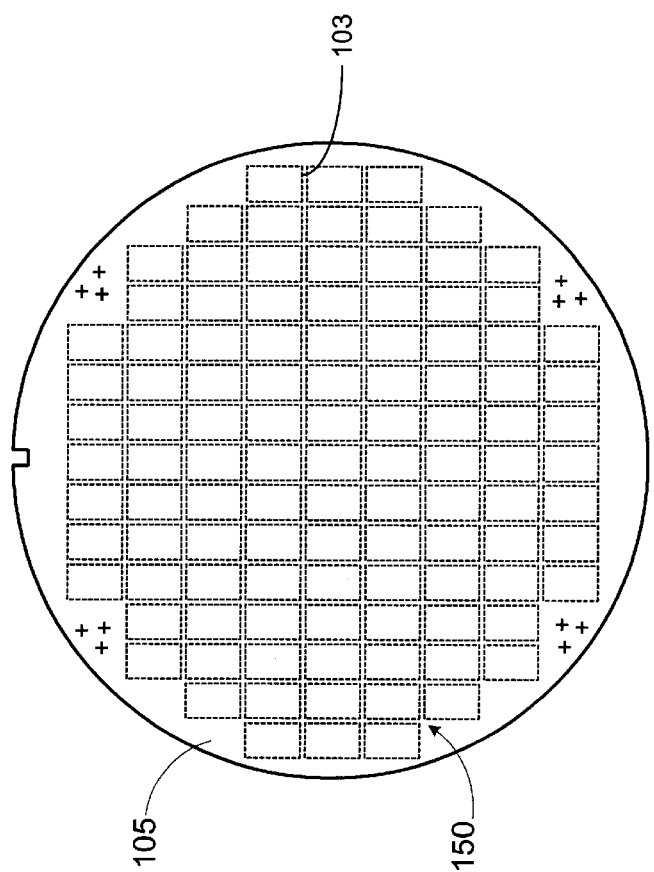
FIG. 1 is a simplified diagram of a prior art semiconductor wafer being processed.
Figure 2:
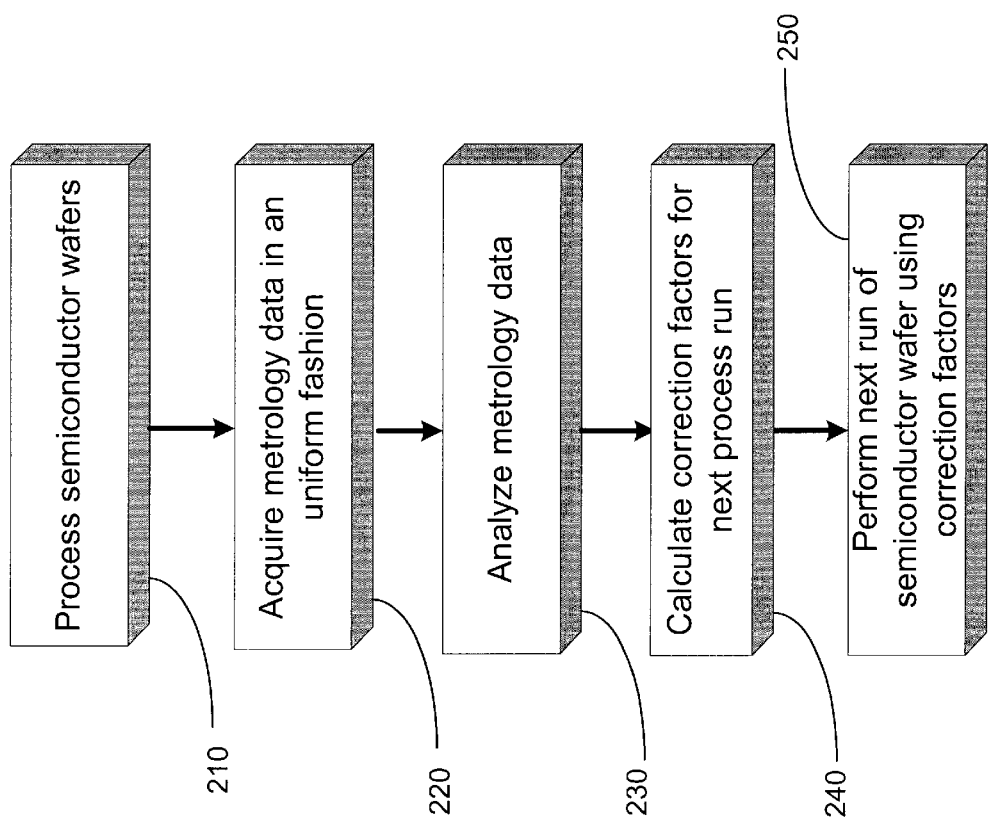
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Often, at least a portion of a manufacturing lot of semiconductor wafers are examined by offline metrology tools after a process is performed on the semiconductor wafers to acquire post process metrology data. Errors discovered during this examination can be used to generate modifications for subsequent processes performed on the semiconductor wafers. These modifications to the new process are generally used to reduce the effects of errors discovered in the original process. Many times, offline metrology data results become available too late for performing such modifications.

In a very general sense, embodiments of the present invention provide for performing integrated metrology data acquisition for more efficient and meaningful feed-forward/feedback modifications to subsequent processes. Embodiments of the present invention provide for modifying the number of sites on a wafer that are examined by the integrated metrology tool in order to compensate for variations in the time period required to acquire metrology data without interrupting the process flow. Embodiments of the present invention may be used to perform a wafer-to-wafer feedback/feed-forward process control on semiconductor wafers.

Figure 3:
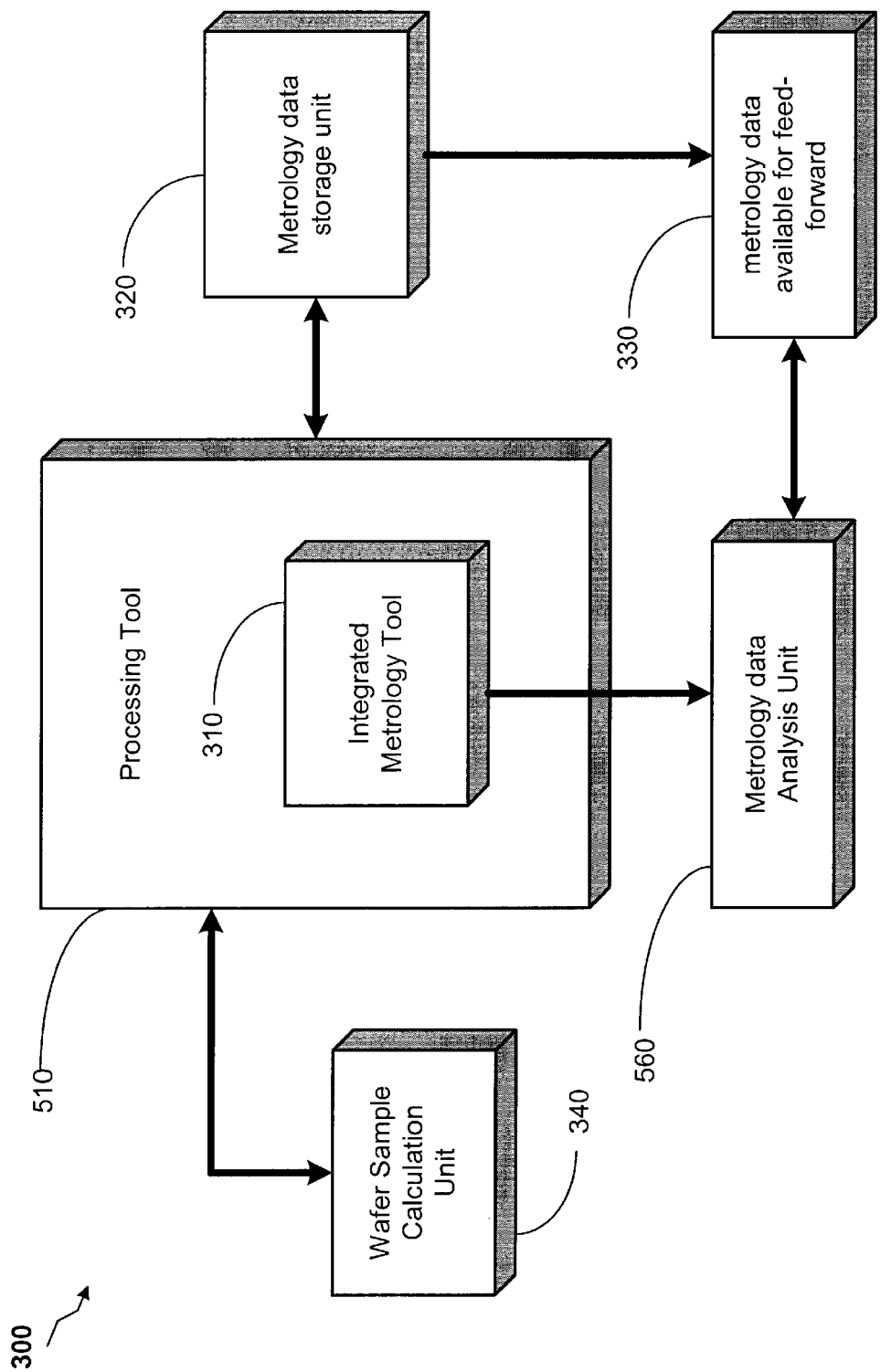
FIG. 3 is a block diagram representation of a system in accordance with one illustrative embodiment of the present invention.

Turning now to FIG. 3, a system 300 capable of performing the methods taught by one embodiment of the present invention, is illustrated. In one embodiment, a processing tool 510 comprises an integrated metrology tool 310. In one embodiment, the integrated metrology tool 310 may be incorporated into the flow of semiconductor wafers 105 through a processing tool 510. In other words, the semiconductor wafers 105 generally pass through the integrated metrology tool 310 as the wafers 105 would pass through other processing stations (not shown) on the processing tool 510. The integrated metrology tool 310 is capable of acquiring inline metrology data (e.g., acquiring metrology data of semiconductor wafers 105 while they are still under the control of the processing tool 510). In one embodiment, inline metrology data includes metrology data that are traditionally acquired by a standalone metrology tool yielding data associated with a particular processing operation. For example, inline metrology data may include data relating to film thickness, line-width of certain formations on processed semiconductor wafers 105, overlay measurements resulting from photolithography measurements, and the like. Acquiring inline metrology data is generally less intrusive to a manufacturing process flow, as compared to acquiring offline metrology data, which requires the use of an external metrology data tool.

The integrated metrology tool 310 acquires metro logy data in an inline fashion. In other words, during, or immediately following a manufacturing process, the integrated metrology tool 310 acquires data from the processed semiconductor wafers 105. In one embodiment, the integrated metro logy tool 310 is placed within a chamber (not shown) associated with the processing tool 510. In one embodiment, the integrated metrology tool 310 sends metro logy data (real-time or near real-time data) to a metro logy data storage unit 320. The metrology data storage unit 320 stores the metrology data such that it can be retrieved by the system 300 for further analysis during or after a manufacturing process cycle.

Data from the integrated metrology tool 310 may also be sent to the metrology data analysis unit 560. The metrology data analysis unit 560 is capable of correlating particular metro logy data to corresponding semiconductor wafers 105. In one embodiment, metro logy data analysis unit 560 also sends metrology data to the metrology data storage unit 320 for storage. The real-time, or near real-time, metrology data stored in the metrology data storage unit 320 provides the system 300 accessibility to immediate manufacturing data that can be used to further correct or enhance the accuracy of one or more processes performed on the semiconductor wafers 105.

The system 300 also comprises a wafer sample calculation unit 340. The wafer 5 sample calculation unit 340 is capable of calculating an efficient sample rate for analyzing a select number of semiconductor wafers 105 being processed in the processing tool 510. In other words, instead of analyzing each semiconductor wafer 105 processed by the processing tool 510, the wafer sample calculation unit 340 calculates a selected number of wafers that is less than the total number of wafers being processed for analysis by the integrated metrology tool 310. In one embodiment, the wafer sample calculation unit 340 calculates an optimum number of wafers, which does not interfere with the processing flow of semiconductor wafers 105 from one processing tool 510a to another tool 510b, yet provides a sufficient amount of metrology data for feedback and/or feed-forward purposes. The processing tool 510a routes a certain number of semiconductor wafers 105 dictated by the wafer sample calculation unit 340 to the integrated metrology tool 310, while the non-selected semiconductor wafers 105 are routed to another processing tool 510b.

Figure 4:
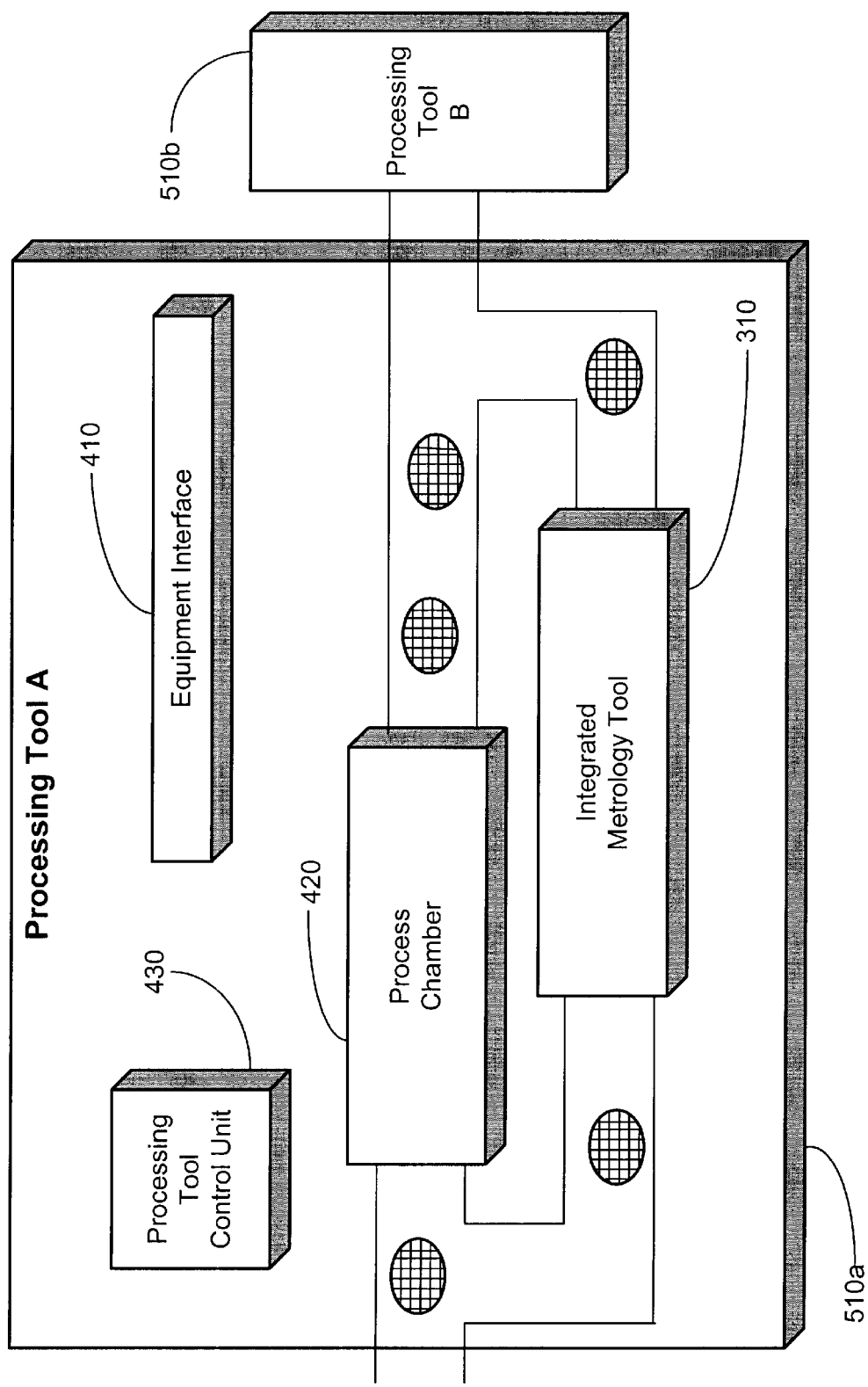
FIG. 4 illustrates a more detailed block diagram representation of a processing tool shown in FIGS. 3 and 4, in accordance with one illustrative embodiment of the present invention.

Turning now to FIG. 4, a more detailed block diagram illustration of an illustrative processing tool, such as processing tool 510a is shown. In one embodiment, the processing tool 510a comprises an equipment interface 410, a process chamber 420, a processing tool control unit 430, and an integrated metrology tool 310. The processing tool 510a receives control parameter data via the equipment interface 410. Data from the processing tool 510a is also sent to other portions of the system 300, such as the computer system 530, shown in FIG. 5, via the equipment interface 410. The processing tool control unit 430 controls processing operations of semiconductor wafers 105 in the process chamber 420. The processing tool control unit 430 receives control parameter data and/or instructions from the computer system 530, via the equipment interface 410 and executes the appropriate action.

The integrated metrology tool 310 acquires metrology data from the semiconductor wafers 105 that were processed in the process chamber 420. In one embodiment, the integrated metrology tool 310 acquires inline metrology data. The processing tool control unit 430 also controls the integrated metrology tool 310. In accordance with embodiments of the present invention, the integrated metrology tool 310 acquires real-time or near real-time metrology data from semiconductor wafers 105 processed and makes such data available to the system 300 for more efficient analysis of metrology data.

In one embodiment, the equipment interface 410 receives sample data from the wafer sample calculation unit 340. The sample data indicates the number of processed semiconductor wafers 105 to be analyzed by the integrated metrology tool 310. In one embodiment, the processing tool control unit 430 receives the wafer sample data and sends a certain number of sample wafers to the integrated metrology tool 310 while routing the other wafers 105 to the next processing tool, e.g., processing tool B 510b. Communications between processing tool A 510a and processing tool B 510b are coordinated by the system 300 such that the production wafers 105 are routed directly from the process chamber 420 on processing tool A 510a to processing tool B 510b, while a certain amount of wafers 105 are routed via the integrated metrology tool 310 to the processing tool B 510b as indicated in. FIG. 4. Similarly, processing tool B 510b also receives sample data from the wafer sample calculation unit 340 and performs the sampling described above. Furthermore, feed-forward and/or feedback data is calculated by the system 300 using the data acquired by the integrated metrology tool 310. The feed-forward and/or feedback data can be implemented into the processes performed by the processing tool B 510b.

Figure 5:
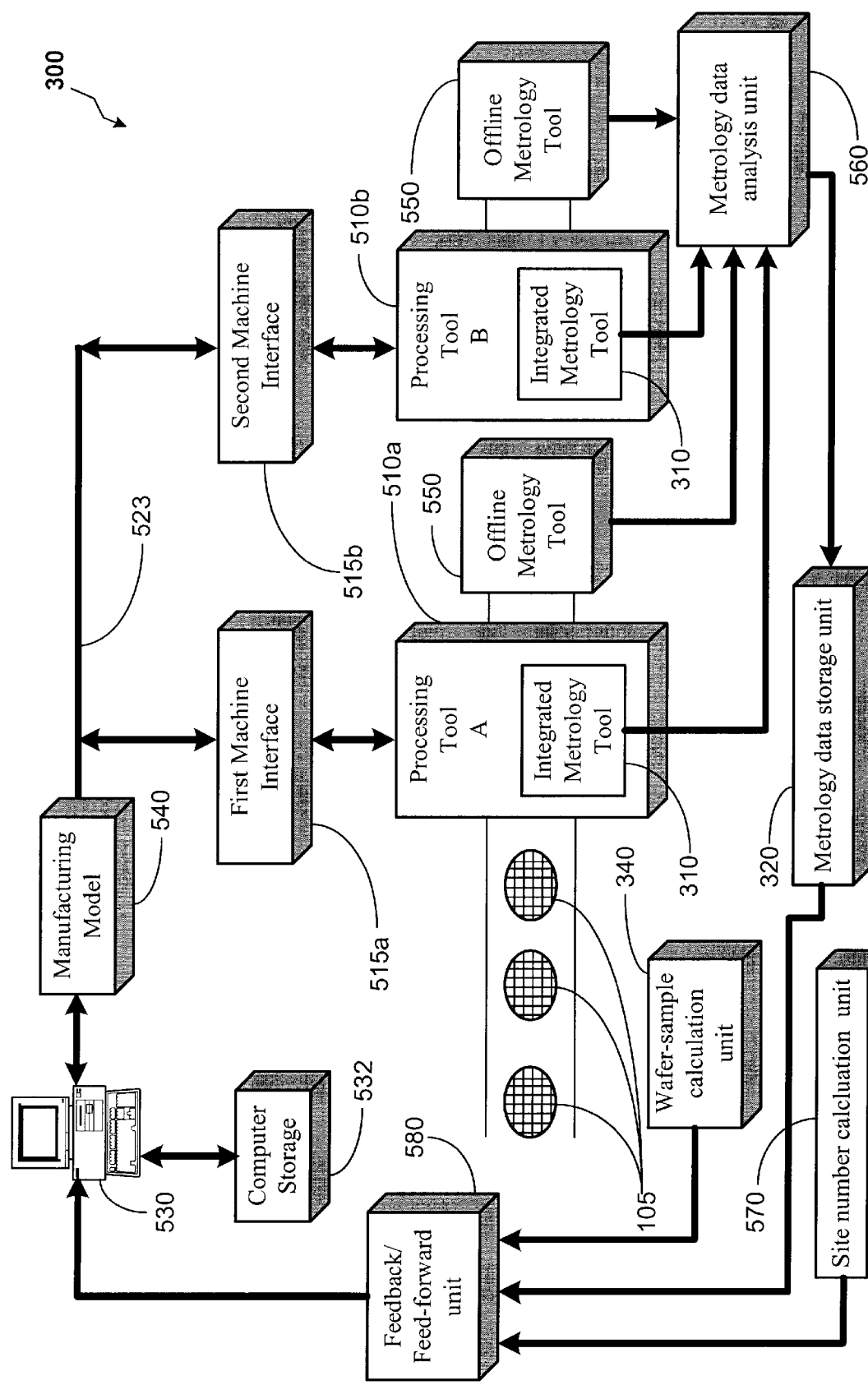
FIG. 5 illustrates a more detailed block diagram representation of the system shown in FIG. 3 in accordance with one illustrative embodiment of the present invention.

Turning now to FIG. 5, a more detailed block diagram of the system 300 in accordance with one embodiment of the present invention is illustrated. In one embodiment, semiconductor wafers 105 are processed on processing tools 510a, 510b using a plurality of control input signals, or manufacturing parameters, provided via a line or network 523. In one embodiment, control input signals, or manufacturing parameters, on the line 523 are sent to the processing tools 510a, 510b from a computer system 530 via machine interfaces 515a, 515b. In one embodiment, the first and second machine interfaces 515a, 515b are located outside the processing tools 510a, 510b. In an alternative embodiment, the first and second machine interfaces 515a, 515b are located within the processing tools 510a, 510b. The semiconductor wafers 105 are provided to and carried from a plurality of processing tools 510. In one embodiment, semiconductor wafers 105 may be provided to a processing tool 510 manually. In an alternative embodiment, semiconductor wafers 105 may be provided to a processing tool 510 in an automatic fashion (e.g., robotic movement of semiconductor wafers 105). In one embodiment, a plurality of semiconductor wafers 105 are transported in lots (e.g., stacked in cassettes) to the processing tools 510.

In one embodiment, the computer system 530 sends control input signals, or manufacturing parameters, on the line 523 to the first and second machine interfaces 515a, 515b. The computer system 530 is capable of controlling processing operations. In one embodiment, the computer system 530 is a process controller. The computer system 530 is coupled to a computer storage unit 532 that may contain a plurality of software programs and data sets. The computer system 530 may contain one or more processors (not shown) that are capable of performing the operations described herein. The computer system 530 employs a manufacturing model 540 to generate control input signals on the line 523. In one embodiment, the manufacturing model 540 contains a manufacturing recipe that determines a plurality of control input parameters that are sent on the line 523 to the processing tools 510a, 510b.

In one embodiment, the manufacturing model 540 defines a process script and input control that implement a particular manufacturing process. The control input signals (or control input parameters) on the line 523 that are intended for processing tool A 510a are received and processed by the first machine interface 515a. The control input signals on the line 523 that are intended for processing tool B 510b are received and processed by the second machine interface 515b. Examples of the processing tools 510a, 510b used in semiconductor manufacturing processes are steppers, etch process tools, deposition tools, and the like.

One or more of the semiconductor wafers 105 that are processed by the processing tools 510a, 510b can also be sent to an offline metrology tool 550 for acquisition of metrology data. The offline metrology tool 550 can be a scatterometry data acquisition tool, an overlay-error measurement tool, a critical dimension measurement tool, and the like. In one embodiment, one or more processed semiconductor wafers 105 are examined by an offline metrology tool 550. Furthermore, metrology data may also be collected by the integrated metro logy tool 310 within the processing tools 510a and 510b. Data from the integrated metrology tool 310 and the offline metrology tool 550 may be collected by the metrology data analysis unit 560. The metrology data is directed to a variety of physical or electrical characteristics of the devices formed on the wafers 105. For example metrology data may be obtained as to line width measurements, depth of trenches, sidewall angles, thickness, resistance, and the like. As described above, the metrology data analysis unit 560 organizes, analyses, and correlates metrology data acquired by the offline metrology tool 550 to particular semiconductor wafers 105 that were examined.

In one embodiment, the metrology data analysis unit 560 sends inline metrology data and offline metrology data, from the integrated metrology tool 310 and offline metrology tool 550, respectively, to the metrology data storage unit 320 for storage. The system 300 is able to retrieve inline metrology data and offline metrology data and perform feed-forward analysis. Based upon specific request for data, the inline metrology data and the offline metrology data are sent to the feedback/feed-forward unit 580 for generation of feed-forward and/or feedback data. The feedback/feed-forward unit 580 is capable of performing a feedback/feed-forward operation, which is described in detail below. In one embodiment, the system 300 calculates adjustments to subsequent processes so that the effects of the errors in previous processing operations performed on the semiconductor wafers 105 are reduced.

In one embodiment, the feedback/feed-forward unit 580 is capable of calculating adjustment data that can be used to modify the control input parameters provided to one or more processing tools 510 that will subsequently perform various processes on the semiconductor wafers 105. The modification of the control input parameters are designed to reduce the effects of errors discovered on the semiconductor wafers 105. The feedback/feed-forward data is analyzed by the computer system 530, which then uses the manufacturing model 540 to modify control input parameters that control the operation of the processing tools 510. In one embodiment, the metrology data storage unit 320, the metrology data analysis unit 560, and/or the feedback/feed-forward unit 580 are software or firmware components of a computer system that can be a standalone unit or that can be integrated into the computer system 530.

The feedback unit 580 receives data from the wafer sample calculation unit 340 and from the site number calculation unit 570. As described above, the wafer sample calculation unit 340 provides a number of sample wafers to be analyzed by the integrated metrology tool 310 within the processing tool 510. The site number calculation unit 570 calculates a number of sites on each semiconductor wafer 105 to be analyzed by the integrated metrology tool 310. The site number calculation unit 570 calculates the amount of time that is available for analysis of the sample semiconductor wafers 105 without interrupting the process flow of semiconductor wafers 105, e.g., process flow from processing tool A 510a to processing tool B 510b. Based upon the available time, an additional number of sites on semiconductor wafers 105 can be analyzed.

Conversely, based upon a shortage of available time for acquiring metrology data, a reduced number of sites on a semiconductor wafer 105 may be analyzed. Therefore, the site number calculation unit 570 maximizes the amount of time available for acquisition of metrology data. The sample data, the site number data, and the metrology data storage unit data are received by the feedback/feed-forward unit 580 and in response, the unit 580 generates feedback/feed-forward data for subsequent processes. Such data is then sent to the computer system 530, which performs modifications to control input parameters via the manufacturing model 540, the machine interface 515, and the equipment interface 410.

Figure 6:
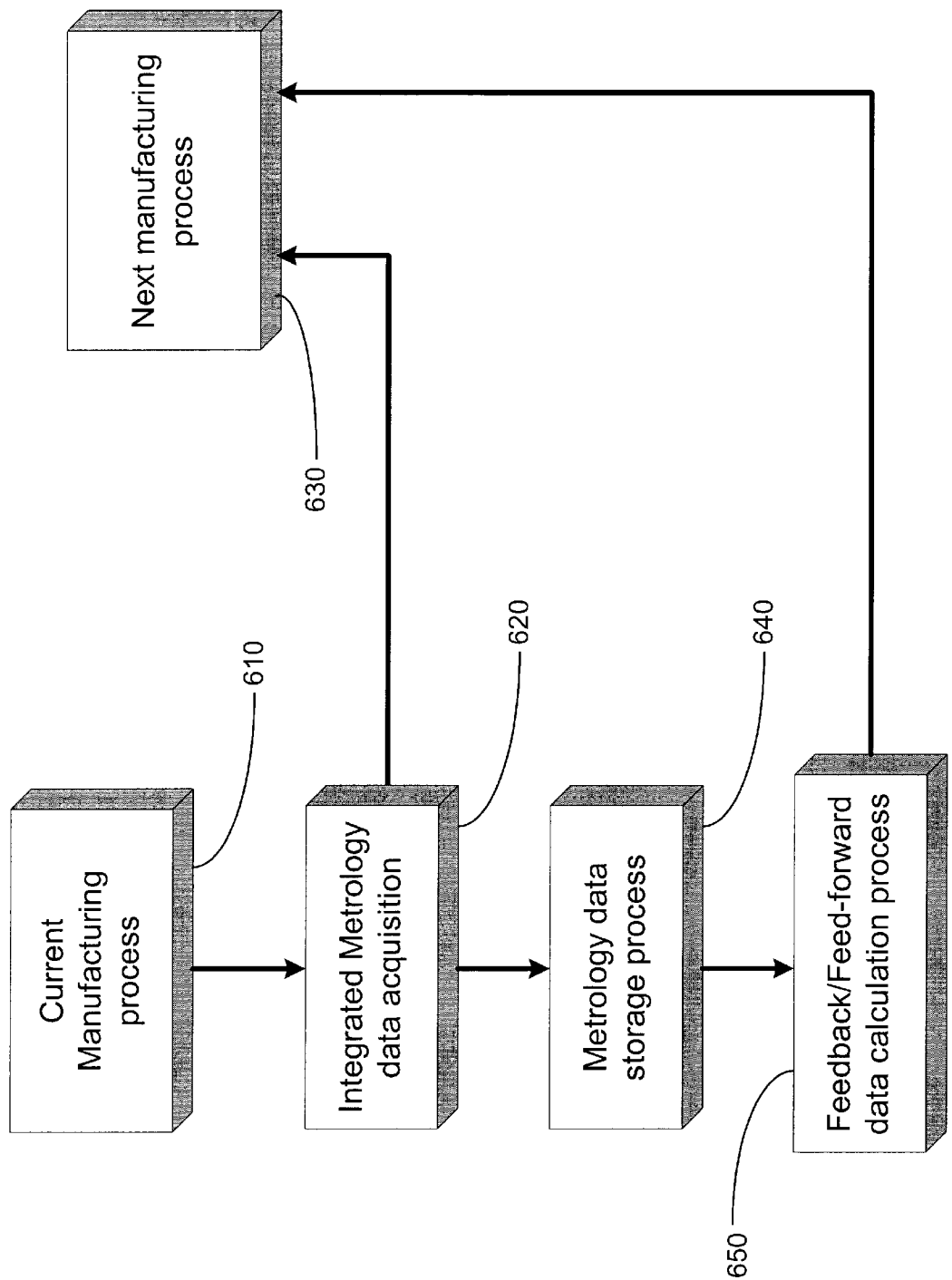
FIG. 6 illustrates a block diagram representation of a process flow in accordance with one illustrative embodiment of the present invention.

Turning now to FIG. 6, a block diagram illustration of a process flow in accordance with one embodiment of the present invention is illustrated. The system 300 performs a current manufacturing process on a plurality of semiconductor wafers 105. For example, the current process may be performed by processing tool A 510a. The system 300 then routes a certain number of sample wafers 105 to the integrated metrology tool 310 for integrated metrology data acquisition (block 620). Approximately simultaneously, the system 300 routes the non-sampled semiconductor wafers 105 directly from the current manufacturing process (block 610) to the next manufacturing process (block 630). In one embodiment, the next manufacturing process is performed by processing tool B 510b. Meanwhile, inline metrology data is acquired by the integrated metrology tool (block 620) and the measured wafers are also then routed to the next manufacturing process (block 630). In one embodiment, the acquired metrology data is stored (block 640). While a plurality of semiconductor wafers 105 are in queue to be processed by the next semiconductor process (block 630), the metrology data is sent to a metrology data storage process (block 640).

The system 300 then retrieves stored metrology data and performs a feedback/feed-forward data calculation process (block 650). The feedback/feed-forward process nets feedback and feed-forward data that can be used to modify control input parameters for the operation of the next manufacturing process (block 630). In one embodiment, the semiconductor process flow, from the current manufacturing process extending to the next manufacturing process (block 630), is not interrupted by the metrology data acquisition performed on the sample wafers 105 that are then sent to the next manufacturing process 630. The feedback/feed-forward data is utilized by the next manufacturing process 630 to perform processes on the semiconductor wafers 105.

Figure 7:
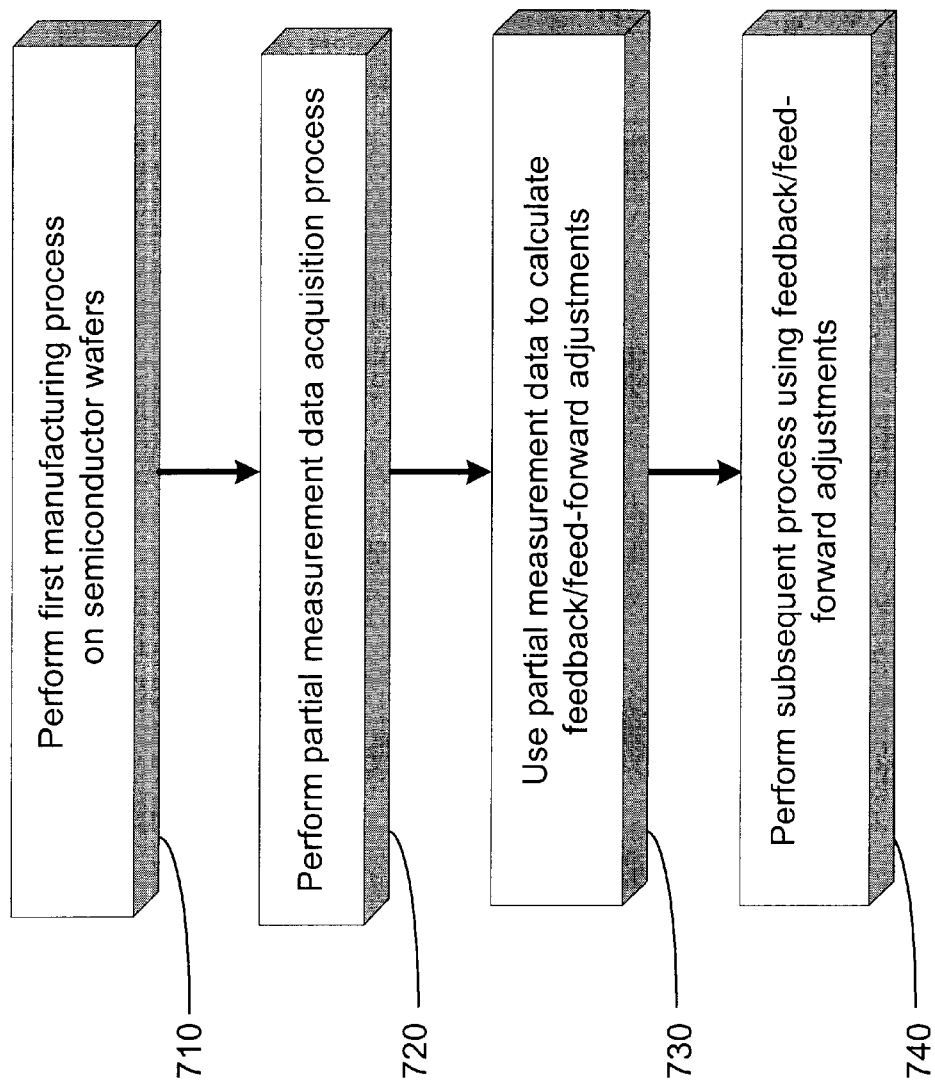
FIG. 7 illustrates a flowchart depiction of a method in accordance with one illustrative embodiment of the present invention.

Turning now to FIG. 7, a flowchart depiction of the methods in accordance with one embodiment of the present invention is illustrated. The system 300 performs a first manufacturing process on a lot of semiconductor wafers 105 (block 710). While manufacturing the semiconductor wafers 105, the system 300 performs a partial measurement data acquisition process (block 720). A more detailed illustration, and accompanying description of performing the partial measurement data acquisition process indicated in block 720 are provided below. Once the system 300 performs a partial measurement data acquisition process, the system 300 uses the partial measurement data to calculate feedback and/or feed-forward adjustments (block 730). Generally, the partial measurement data acquisition process nets metrology measurements for a sample of semiconductor wafers 105 being processed by the first manufacturing process.

The system 300 then performs a second process on semiconductor wafers. In one embodiment, a plurality of wafers are sent from the first manufacturing process directly to the second manufacturing process (block 740). Meanwhile, the plurality of sample wafers 105 are used to perform the partial measurement data acquisition process without interrupting the flow of the semiconductor wafers 105 from the first manufacturing process to the second manufacturing process. Furthermore, feedback and feed-forward data is available for processing the second manufacturing process (data acquired from semiconductor wafers 105 processed by the first manufacturing process).

Figure 8:
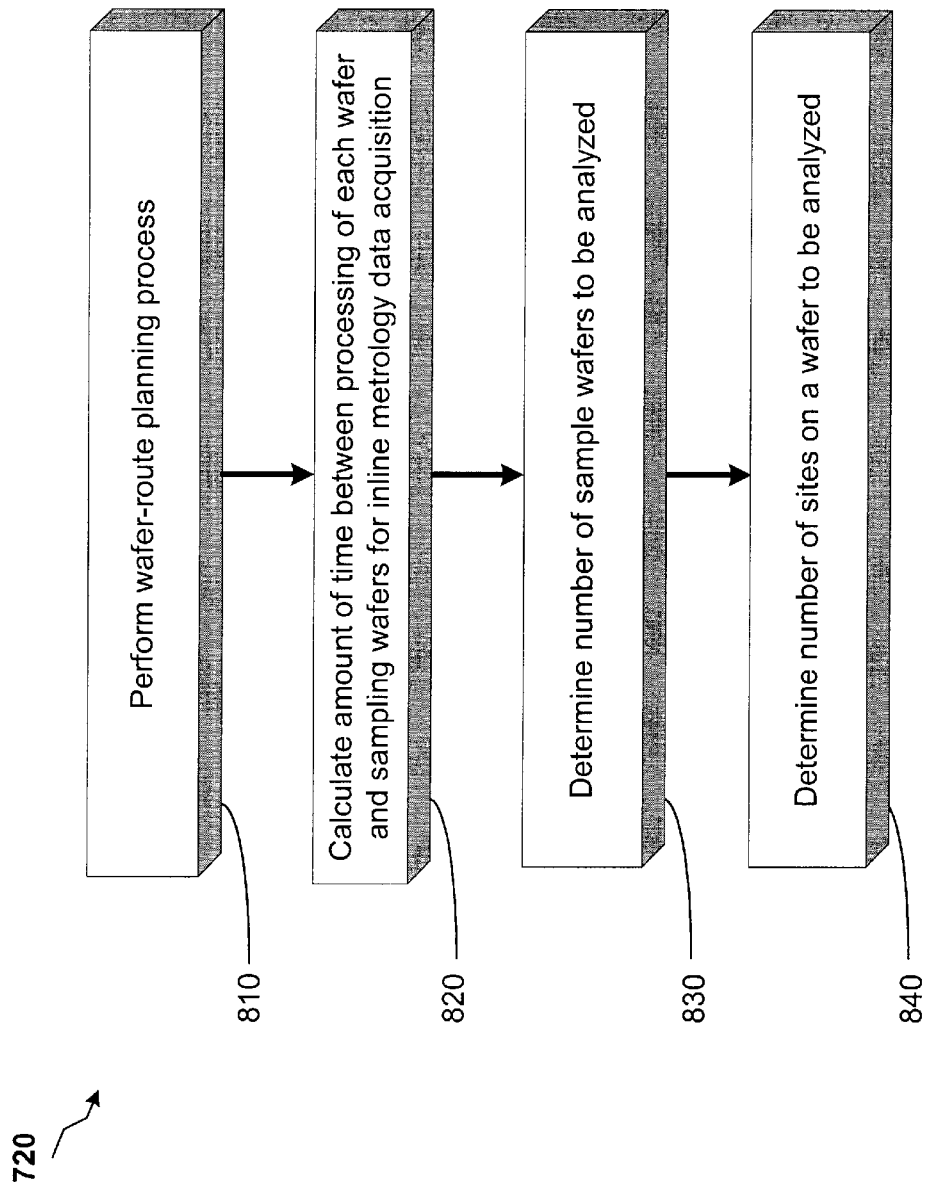
FIG. 8 illustrates a flowchart depiction of a method of performing a partial measurement data acquisition process, as indicated in FIG. 7, in accordance with one illustrative embodiment of the present invention.

Turning now to FIG. 8, a flowchart depiction of steps for performing the partial measurement data acquisition process indicated in block 720 of FIG. 7 is illustrated. The system 300 performs a wafer route planning process (block 810). In one embodiment, the wafer route planning process is performed by the computer system 530. The wafer route planning process comprises determining the number of wafers that are being processed by a processing tool A 510a and processing tool B 510b. The planning process of block 810 also comprises determining the number of wafers 105 to be processed, the speed of the process performed on the wafers 105, and the speed of the transport of wafers 105 from one processing tool to another, and the like. The speed of the process can be calculated by analyzing factors such as the amount of area on a semiconductor wafer 105 that is to be processed, a type of process to be performed on the semiconductor wafer, the preparatory time needed before a particular process and the like.

The speed of the transport of wafers 105 includes the routing time of wafers 105 from one processing tool 510 to another, which includes the physical distance between a plurality of processing tools 510. Based upon the data related to the wafer route planning process, the system 300 calculates the amount of time available between the processing of each wafer 105 in order to determine an appropriate number of sample wafers 105 for metrology data acquisition by the integrated metrology tool 310 (block 820). In other words, an amount of time that coincides with routing a particular number of sample wafers 105 from the process chamber 420 to the integrated metrology tool 310, and time needed to forward the sampled wafers to a second processing tool 510, is calculated. Based upon the time available for sampling the wafers 105, a sample number of wafers 105 are determined by the system 300 (block 830). For example, the system 300 may determine that every two of three semiconductor wafers 105 processed in the process chamber 420 can be sent to the integrated metrology tool 310 for analysis before being routed to a second processing tool 510, along with the wafers 105 that were not sampled. In this manner, a steady flow of semiconductor wafers 105 from processing tool A 510a are provided to processing tool B 510b, while a certain number of sample wafers 105 are analyzed by the integrated metrology tool 310 without disturbing the flow of semiconductor wafers 105 from processing tool A 510a to processing tool B 510b.

Furthermore, the system 300 can determine a number of sites on the sample semiconductor wafers 105 to be analyzed by the integrated metrology tool 310 (block 840). When the system 300 determines that additional time is available to analyze the sampled processes, but not enough to analyze an entire wafer, additional sites on each of the sample wafers can be added for metrology analysis. Therefore, the time available for metrology data acquisition is maximized. The more sites on a wafer that is measured, the more robust the metrology data. Therefore, the system 300 maximizes the amount of metrology data that is acquired in the allotted time set aside by the system 300 for the integrated metrology data acquisition process. The completion of the steps described in FIG. 8 substantially completes the process of performing the partial data measurement acquisition process indicated in block 720 of FIG. 7.

Figure 9:
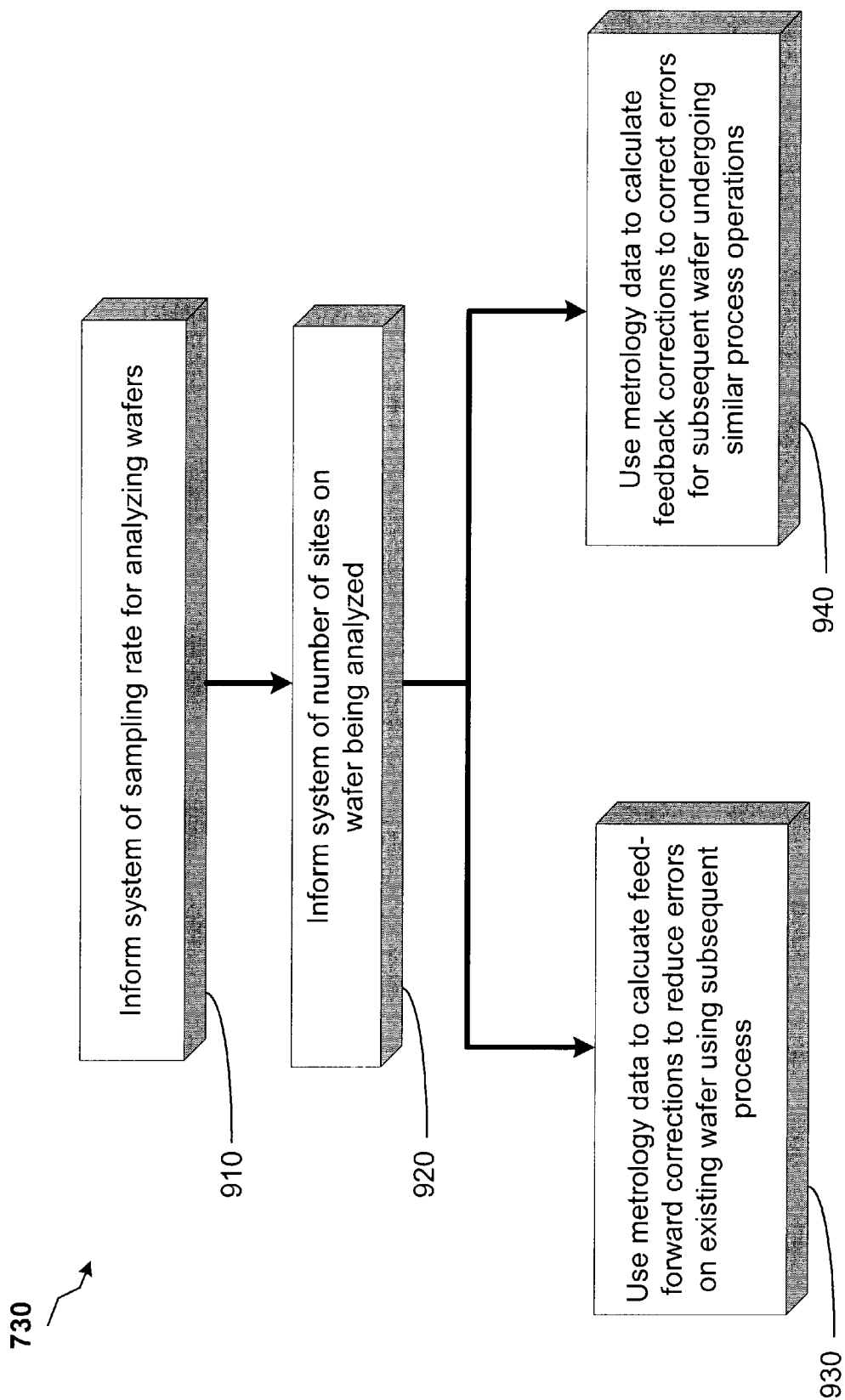
FIG. 9 illustrates a flowchart depiction of a method of using the partial measurement data of FIG. 8 to perform feedback/feed-forward calculations, as indicated in FIG. 7, in accordance with illustrative one embodiment of the present invention.

Turning now to FIG. 9, a flowchart depiction of the steps for calculating feedback/feed-forward adjustments based upon the partial measurement data from the partial measurement data acquisition process (blocks 720 and 730), is illustrated. The processing tool 510 informs the system 300 of the sampling rate that is to be implemented for acquisition of inline metrology data (block 910). The indication to the system 300 regarding the sampling rate provides the system 300 with information regarding the quality and the accuracy of the inline metrology data acquired by the integrated metrology tool 310. In other words, if the sample rate is high (e.g., 75% of processed wafers being analyzed by metrology tool 310), then the metrology data can be deemed to be relatively accurate. However, if the sampling rate is low (e.g., only 25% of the wafers being analyzed by the metrology tool 310), the metrology data may not be relatively accurate. The system 300 then takes the accuracy of the metrology data into account when calculating feedback and feed-forward correction data.

The processing tool 510 also informs the system 300 of the number of sites examined on the sample wafers 105 (block 920). Generally, the higher the number of sites on a particular sample wafer 105 that are analyzed, the more accurate and reliable the metrology data. In certain situations, the system 300 may decide that a smaller number of sites can be analyzed by the integrated metrology tool 310 due to the time constraints because of the increased number of wafers 105 that are sampled. Generally, the smaller the sampling rate (i.e., the number of wafers 105 analyzed by the integrated metrology tool 310), the larger the desired site number. The system 300 can use the number of sites as an indication of the reliability of the metrology data. The sampling rate and the number of sites are used by the system 300 to determine the weight of the metrology data. For example, when the sampling rate is 67% (e.g., analyzing every two of three wafers that are processed) relatively high and a large number of sites are examined, the weight of the metrology data is higher than when the sampling rated is 50% and a smaller number of sites are examined. The greater the weight of the data, the more likely the system 300 will modify control parameters for subsequent wafers.

The system 300, knowing the information of the sampling rate and the number of sites, uses the metrology data to calculate feed-forward corrections to reduce the errors on existing wafers 105 by implementing them on subsequent processes performed on the wafers 105 (block 930). In other words, detected errors resulting from the first process performed on the semiconductor wafers 105 may be compensated by performing feed-forward corrections on the same wafers 105 during subsequent processes. For example, during a photolithography process, if the line-width of the feature formed in the layer of photoresist is too wide, a subsequent etch process can be modified to etch the excessively wide line photoresist features down to an acceptable range an/or to over-etch the underlying process layer.

Likewise, the sampling rate and the number of site information used by the system 300 to perform a feedback data correction using the metrology data, for subsequent wafers 105 are undergoing similar processes (block 940). Generally, based upon errors detected due to the first process, the system 300 can calculate corrective measures for similar processes performed on the semiconductor wafers 105. Completion of the steps described in FIG. 9 substantially completes the step of using partial measurement data to calculate feedback/feed-forward adjustments indicated in block 730 of FIG. 7. The innovative use of sampling of wafers 105 using an integrated metrology tool 310 and manipulating the number of sites examined on a semiconductor wafer 105 to provide increased efficiency in processing wafers while acquiring meaningful data, taught by embodiments of the present invention can increase the accuracy and efficiency of manufacturing quality semiconductor wafers 105.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing a process on a first semiconductor wafer;
    acquiring inline metrology data related to said process of said first semiconductor wafer;
    performing a partial measurement data acquisition process based upon said inline metrology data, said partial measurement data acquisition process comprising determining a time period for acquiring said inline metrology data, determining a number of wafers to be sampled based upon said time period, and determining a number of wafer sites for data acquisition; and
    performing at least one of a feedback adjustment on a second semiconductor wafer and a feed-forward adjustment relating to a subsequent processing of said first semiconductor wafer based upon said partial measurement data acquisition process.

2. The method described in claim 1, wherein acquiring inline metrology data related to said first process of said semiconductor wafer acquiring metrology data using an integrated metrology tool.

3. The method described in claim 1, wherein performing a partial measurement data acquisition process based upon said inline metrology data further comprises:
    performing a wafer-route planning process to determine a manufacturing process flow;
    calculating a period of time available for acquiring inline metrology data while maintaining a manufacturing process flow based upon said wafer-route planning process;

calculating said number of wafers to be sampled based upon said period of time; and determining said number of wafer sites for data acquisition based upon at least one of said calculated number of wafers to be sampled and said calculated period of time.

4. The method described in claim 1, wherein performing said feedback adjustment further comprises:

determining a weight of said inline metrology data based upon said number of wafers to be sampled and said number of wafer sites;

determining an error of said process based upon said weight of said inline metrology data; and determining a feedback correction parameter of said process based upon said determined error to reduce said error of said process.

5. The method described in claim 4, further comprising performing said process comprised of said feedback correction parameter on a subsequent semiconductor wafer.

6. The method described in claim 4, further comprising performing a wafer-to-wafer feedback correction based upon said feedback correction parameter.

7. The method described in claim 1, wherein performing said feed-forward adjustment further comprises:

determining a weight of said inline metrology data based upon said number of wafers to be sampled and said number of wafer sites;

determining an error of said process based upon said weight of said inline metrology data; and determining a feed-forward correction parameter of said process based upon said determination to reduce an effect of said error.

8. The method described in claim 7, further comprising performing a subsequent process comprised of said feed-forward parameter on said semiconductor wafer.

9. The method described in claim 7, further comprising performing a wafer-to-wafer feed-forward correction based upon said feed-forward correction parameter.

10. A method, comprising:

performing a process on a semiconductor wafer;

acquiring inline metrology data related to said process of said semiconductor wafer using an integrated metrology tool;

determining a time period for acquiring said inline metrology data, determining said time period comprises calculating a period of time available for acquiring inline metrology data while maintaining a manufacturing process flow based upon said wafer-route planning process;

determining a number of wafers to be sampled based upon said time period;

determining a number of wafer sites for data acquisition; and performing at least one of a feedback adjustment on a second semiconductor wafer and a feed-forward adjustment relating to a subsequent processing of said first semiconductor wafer based upon said partial measurement data acquisition process.

11. The method described in claim 10, wherein performing said feedback adjustment further comprises:

determining a weight of said inline metrology data based upon said number of wafers to be sampled and said number of wafer sites;

determining an error of said process based upon said weight of said inline metrology data; and determining a feedback correction parameter of said process based upon said determined error to reduce said error of said process.

12. The method described in claim 11, further comprising performing said process comprised of said feedback correction parameter on a subsequent semiconductor wafer.

13. The method described in claim 10, wherein performing said feed-forward adjustment further comprises:

determining a weight of said inline metrology data based upon said number of wafers to be sampled and said number of wafer sites;

determining an error of said process based upon said weight of said inline metrology data; and determining a feed-forward correction parameter of said process based upon said determination to reduce an effect of said error.

14. The method described in claim 13, further comprising performing a subsequent process comprised of said feed-forward parameter on said semiconductor wafer.

15. A system, comprising:

a processing tool to process a semiconductor wafer;

an integrated metrology tool integrated into said processing tool, said integrated metrology tool to acquire inline metrology data;

a process controller operatively coupled to said processing tool and said integrated metrology tool, said process controller to perform an inline metrology feedback/feed-forward operation, said inline metrology feed-forward operation comprising:

acquiring inline metrology data related to a first process of a semiconductor wafer using an integrated metrology tool;

performing a partial measurement data acquisition process based upon said inline metrology data, said partial measurement data acquisition process comprising determining a time period for acquiring said inline metrology data, determining a number of wafers to be sampled based upon said time period, and determining a number of wafer sites for data acquisition;

an inline metrology data storage unit operatively coupled to said process controller, said inline metrology data storage unit to receive said inline metrology data; and a feedback/feed-forward unit operatively coupled to said process controller, said feedback/feed-forward unit to perform said feedback/feed-forward operation.

16. The system of claim 15, further comprising:

a computer system operatively coupled with said feed-forward unit, said computer system to perform at least one calculation of a compensation factor for performing said feed-forward operation;

a manufacturing model operatively coupled with said computer system, said manufacturing model to generate and modify at least one control input parameter signal;

a machine interface operatively coupled with said manufacturing model, said machine interface being capable of receiving process recipes from said manufacturing model;

a processing tool capable of processing semiconductor wafers and operatively coupled with said machine interface, said first processing tool to receive at least one control input parameter signal from said machine interface; and an integrated metrology tool integrated with said processing tool, said integrated metrology tool to acquire said inline metrology data and sending said inline metrology data to said inline metrology data storage unit;

a wafer sample calculation unit operatively coupled to said feedback/feed-forward unit, said wafer sample calculation unit to determine said number of wafers to be sampled for inline metrology data acquisition; and a site number calculation unit operatively coupled to said feedback/feed-forward unit, said site number calculation unit to determine said number of wafer sites to be analyzed.

17. The system of claim 16, wherein said computer system is capable of generating modification data for modifying at least one parameter in said manufacturing model in response to said feedback/feed-forward operation.

18. An apparatus, comprising:

means for performing a process on a semiconductor wafer;

means for acquiring inline metrology data related to said process of said semiconductor wafer;

means for performing a partial measurement data acquisition process based upon said inline metrology data, said partial measurement data acquisition process comprising determining a time period for acquiring said inline metrology data, determining a number of wafers to be sampled based upon said time period, and determining a number of wafer sites for data acquisition; and means for performing at least one of a feedback adjustment on a second semiconductor wafer and a feed-forward adjustment relating to a subsequent processing of said first semiconductor wafer based upon said partial measurement data acquisition process.

19. A computer readable program storage device encoded with instructions that, when executed by a computer, performs a method, comprising:

performing a process on a semiconductor wafer;

acquiring inline metrology data related to said process of said semiconductor wafer;

performing a partial measurement data acquisition process based upon said inline metrology data, said partial measurement data acquisition process comprising determining a time period for acquiring said inline metrology data, determining a number of wafers to be sampled based upon said time period, and determining a number of wafer sites for data acquisition; and performing at least one of a feedback adjustment on a second semiconductor wafer and a feed-forward adjustment relating to a subsequent processing of said first semiconductor wafer based upon said partial measurement data acquisition process.

20. The computer readable program storage device encoded with instructions that, when executed by a computer, performs the method described in claim 19, wherein acquiring inline metrology data related to said first process of said semiconductor wafer acquiring metrology data using an integrated metrology tool.

21. The computer readable program storage device encoded with instructions that, when executed by a computer, performs the method described in claim 19, wherein performing a partial measurement data acquisition process based upon said inline metrology data further comprises:

performing a wafer-route planning process to determine a manufacturing process flow;

calculating a period of time available for acquiring inline metrology data while maintaining a manufacturing process flow based upon said wafer-route planning process;

calculating said number of wafers to be sampled based upon said period of time; and determining said number of wafer sites for data acquisition based upon at least one of said calculated number of wafers to be sampled and said calculated period of time.

22. The computer readable program storage device encoded with instructions that, when executed by a computer, performs the method described in claim 19, wherein performing said feedback adjustment further comprises:

determining a weight of said inline metrology data based upon said number of wafers to be sampled and said number of wafer sites;

determining an error of said process based upon said weight of said inline metrology data; and determining a feedback correction parameter of said process based upon said determined error to reduce said error of said process.

23. The computer readable program storage device encoded with instructions that, when executed by a computer, performs the method described in claim 22, further comprising performing said process on a subsequent semiconductor wafer based upon said feedback correction.

24. The computer readable program storage device encoded with instructions that, when executed by a computer, performs the method described in claim 22, further comprising performing a wafer-to-wafer feedback correction based upon said feedback correction parameter.

25. The computer readable program storage device encoded with instructions that, when executed by a computer, performs the method described in claim 19, wherein performing said feed-forward adjustment further comprises:

determining a weight of said inline metrology data based upon said number of wafers to be sampled and said number of wafer sites;

determining an error of said process based upon said weight of said inline metrology data; and determining a feed-forward correction parameter of said process based upon said determination to reduce an effect of said error.

26. The computer readable program storage device encoded with instructions that, when executed by a computer, performs the method described in claim 25, further comprising performing a subsequent process on said semiconductor wafer based upon said feed-forward correction.

27. The computer readable program storage device encoded with instructions that, when executed by a computer, performs the method described in claim 25, further comprising performing a wafer-to-wafer feed-forward correction based upon said feed-forward correction parameter.

* * * * *

UNITED STATES PATENT AND TRADEMARK OFFICE
CERTIFICATE OF CORRECTION

PATENT NO. : 6,708,129 B1
DATED : March 16, 2004
INVENTOR(S) : Alexander J. Pasadyn and Matthew A. Purdy It is certified that error appears in the above-identified patent and that said Letters Patent is hereby corrected as shown below:

Column 2,
Line 17, replace "metro logy" with -- metrology --.

Column 5,
Lines 34, 39, 41, 42, 50 and 51, replace "metro logy" with -- metrology --.

Column 6,
Line 54, replace "in." with -- in --.

Column 7,
Line 54, replace "metro logy" with -- metrology --.

Signed and Sealed this

First Day of June, 2004

JON W. DUDAS
*Acting Director of the United States Patent and Trademark Office*